United States Patent
Ichiyoshi

(10) Patent No.: US 7,272,765 B2
(45) Date of Patent: Sep. 18, 2007

(54) TEST APPARATUS AND TEST METHOD FOR TESTING PLURALITY OF DEVICES IN PARALLEL

(75) Inventor: Seiji Ichiyoshi, Tokyo (JP)

(73) Assignee: Advantest Corporation, Tokyo (JP)

( * ) Notice: Subject to any disclaimer, the term of this patent is extended or adjusted under 35 U.S.C. 154(b) by 287 days.

(21) Appl. No.: 10/813,594

(22) Filed: Mar. 30, 2004

(65) Prior Publication Data

US 2004/0255216 A1    Dec. 16, 2004

Related U.S. Application Data

(63) Continuation-in-part of application No. 10/403,817, filed on Mar. 31, 2003.

(30) Foreign Application Priority Data

Mar. 24, 2004    (JP)    ............... PCT/JP04/04046

(51) Int. Cl.
    *G01R 31/28*    (2006.01)
(52) U.S. Cl. ...................................... 714/742
(58) Field of Classification Search ................. 714/742
    See application file for complete search history.

(56) References Cited

U.S. PATENT DOCUMENTS

| 5,025,205 | A | 6/1991 | Mydill et al. |
| 5,425,036 | A | 6/1995 | Liu et al. |
| 5,931,953 | A | 8/1999 | Lesmeister |
| 5,991,907 | A | 11/1999 | Stroud et al. |
| 6,028,439 | A | 2/2000 | Arkin et al. |
| 6,077,304 | A | 6/2000 | Kasuya |
| 6,108,806 | A | 8/2000 | Abramovici et al. |
| 6,202,182 | B1 | 3/2001 | Abramovici et al. |
| 6,631,487 | B1 | 10/2003 | Abramovici et al. |
| 6,754,868 | B2 * | 6/2004 | Bristow et al. ............. 714/744 |
| 2001/0016922 | A1 | 8/2001 | Takasugi et al. |
| 2002/0038203 | A1 | 3/2002 | Tsuchiya |
| 2003/0005375 | A1 | 1/2003 | Takasugi et al. |

FOREIGN PATENT DOCUMENTS

| JP | 63-298178 | 12/1988 |
| JP | 3-128473 | 5/1991 |

(Continued)

OTHER PUBLICATIONS

International Search Report issued for International application No. PCT/JP2004/004046 mailed on Jun. 29, 2004, 2 pages.

(Continued)

*Primary Examiner*—James C Kerveros
(74) *Attorney, Agent, or Firm*—Osha Liang LLP

(57) ABSTRACT

A test apparatus 10 according to the present invention includes: a plurality of test modules 150, connected to either of the plurality of devices under test 100, for supplying a test signal to the connected device under test 100; a plurality of control apparatuses 130 for controlling the plurality of test modules 150, and for testing the plurality of devices under test 100 in parallel; and a connection setting section 140 for switching topology of the plurality of control apparatuses 130 and the plurality of test modules 150 so that the plurality of control apparatuses 10 connect with the plurality of devices under test 100 respectively.

2 Claims, 6 Drawing Sheets

FOREIGN PATENT DOCUMENTS

| | | |
|---|---|---|
| JP | 2583055 | 11/1996 |
| JP | 2583056 | 11/1996 |
| JP | 2583057 | 11/1996 |
| JP | 2587940 | 12/1996 |
| JP | 2587941 | 12/1996 |
| JP | 22627751 | 4/1997 |
| JP | 2000-163456 | 6/2000 |
| JP | 2000-267881 | 9/2000 |
| JP | 2001-506367 | 5/2001 |
| JP | 2001-320386 | 11/2001 |
| JP | 2001-522049 | 11/2001 |
| JP | 2002-141414 | 5/2002 |

OTHER PUBLICATIONS

Japanese Office Action issued for Japanese application No. 2005-504180 mailed on Aug. 30, 2005, 2 pages.

Supplementary European Search Report issued for International application No. PCT/JP2004004046 issued on Nov. 14, 2006, 2 pages.

Explanation of Circumstances Relating To Accelerated Examination submitted in Japanese Application No. 2004-380598 dated Mar. 1, 2007 and English translation thereof, 8 pages.

European Search Report issued in European Application No. EP 06 07 7162 dated Feb. 23, 2007, 6 pages.

Xia J. Q. et al.: "Dynamic Test Emulation for EDA-Based Mixed-Signal Test Development Automation" Proceedings of The International Test Conference (ITC). Washington, Oct. 21-25, 1995, New York, IEEE, US, 761-770, XP000552879 ISBN: 0-7803-2992-9.

Castelnuovo A. et al.: "Emulation-Based Design Errors Identification" Defect and Fault Tolerance in VLSI Systems, 2002. DFT 2002. Proceedings. 17th IEEE International Symposium on Nov. 6-8, 2002, Piscataway, NJ, USA, IEEE Nov. 6, 2002 (Nov. 06, 2002), pp. 365-371, XP010625026 ISBN: 0-7695-1831-1.

Japanese Office Action "Notification of Reasons for Rejection" issued in Japanese Application No. 2004-380598 mailed on Apr. 3, 2007 and English translation thereof, 7 pages.

Dearborn, W. R., Perkins, E. G., Wong, J. J., Rolince, D., "The Virtual Test Program (V Test)", 1998 IEEE Autotestcon Proceedings, IEEE Systems Readiness Technology Conference, 1998 IEEE, U.S.A. IEEE, Aug. 27, 1998, Catalog No. 98CH36179, pp. 149-159.

U.S. Office Action issued in U.S. Appl. No. 10/404,002 mailed on Apr. 9, 2007, 16 pages.

\* cited by examiner

250

| | |
|---|---|
| ⋮ | ⋮ |
| 17h | Switch Select 1 |
| 18h | Switch Select 2 |
| 19h | Switch Select 3 |
| 1Ah | Switch Select 4 |
| 1Bh | Switch Select 5 |
| 1Ch | Switch Select 6 |
| 1Dh | Switch Select 7 |
| 1Eh | Switch Select 8 |
| ⋮ | ⋮ |

| Port 8 | | Port 7 | | Port 6 | | Port 5 | | Port 4 | | Port 3 | | Port 2 | | Port 1 | |
|---|---|---|---|---|---|---|---|---|---|---|---|---|---|---|---|
| ON | CPU No. | ON | CPU No. | ON | CPU No. | ON | CPU No. | ON | CPU No. | ON | CPU No. | ON | CPU No. | ON | CPU No. |

FIG. 7

TEST APPARATUS AND TEST METHOD FOR TESTING PLURALITY OF DEVICES IN PARALLEL

BACKGROUND OF THE INVENTION

This is a continuation-in-part of U.S. patent application Ser. No. 10/403,817, filed on Mar. 31, 2003, which is pending. Further, this application claims priority from a PCT application (unnumbered) filed on Mar. 24, 2004, the contents of which are incorporated herein by reference.

FIELD OF THE INVENTION

The present invention relates to a test apparatus and a test method. More particularly, the present invention relates to a test apparatus and a test method which include a plurality of control apparatuses for testing a plurality of devices under test respectively, and for testing the plurality of devices under test in parallel. The present application relates to a U.S. patent application Ser. No. 10/403,817 filed on Mar. 31, 2003, the contents of which are incorporated herein by reference.

DESCRIPTION OF THE RELATED ART

In a conventional test apparatus, a control apparatus controls a plurality of test modules by providing the plurality of test modules with control data through a control bus, and performs the test of one or a plurality of devices under test connected to the test modules in parallel. For example, such a test apparatus is disclosed in specifications of Japanese patents No. 2,583,055, No. 2,583,056, No. 2,583,057, No. 2,587,940, No. 2,587,941, and No. 2,627,751.

When a complicated logical circuit, such as CPU, is to be tested, there are many test items and it is necessary to test a plurality of devices under test using a different test sequences respectively according to the test result. Therefore, it is preferable to test the plurality of devices under test in parallel and independently. However, in the conventional test apparatus, since one control apparatus tests the plurality of devices under test in parallel, it is necessary to process each of the test sequences sequentially when it tests the plurality of devices under test using different test sequences respectively. Therefore, efficiency of the test is not so high.

Moreover, even if when the test apparatus is constituted for testing the plurality of devices under test with the plurality of control apparatuses, it is difficult to make the various kinds of devices under test, of which the numbers of pins are different from each other, always correspond to the control apparatuses and to test the devices under test when the connections between the plurality of test modules and the plurality of devices under test are fixed.

SUMMARY OF THE INVENTION

Therefore, it is an object of the present invention to provide a test apparatus and a test method which can solve the foregoing problem. The above and other objects can be achieved by combinations described in the independent claims. The dependent claims define further advantageous and exemplary combinations of the present invention.

Therefore, according to the first aspect of the present invention, there is provided a test apparatus for testing a plurality of devices under test. The test apparatus includes: a plurality of test modules, connected to either of the plurality of devices under test, for supplying a test signal to the connected device under test; a plurality of control apparatuses for controlling the plurality of test modules, and for testing the plurality of devices under test in parallel; and a connection setting section for setting topology of the plurality of control apparatuses and the plurality of test modules so that the plurality of control apparatuses connect with the plurality of devices under test respectively.

The plurality of the control apparatuses may control the plurality of test modules according to a test result of the plurality of devices under test respectively, and may perform different test sequences to the plurality of devices under test in parallel.

The connection setting section may switch the topology for the test of the plurality of devices under test by the plurality of control apparatuses based on an instruction of one of the plurality of control apparatuses before the test of the plurality of devices under test by the plurality of control apparatuses.

The connection setting section may include: a serial interface for transmitting a data packet received from the test module to the control apparatus; and an IDLE packet generating section for providing an IDLE packet to fill an empty space in serial data transmitted by the serial interface when the serial interface does not receive the data packet from the test module.

The plurality of control apparatuses may include: a performance judging test executing section for ordering to perform a performance judging test to the device under test for judging performance of the device under test; an operational specification determination section for determining operational specifications of the device under test based on result of the performance judging test; an acceptability judging test executing section for ordering to perform an acceptability judging test to the device under test according to the operational specifications determined by the operational specification determination section; and an acceptability judgment section for judging acceptability of the device under test according to the operational specifications determined by the operational specification determination section based on the result of the acceptability judging test.

According to the second aspect of the present invention, there is provided a test apparatus for testing a plurality of devices under test, including a plurality of control apparatuses for testing the plurality of devices under test in parallel. Each of the plurality of control apparatuses includes: a performance judging test executing section for ordering to perform a performance judging test to the device under test for judging performance of the device under test; an operational specification determination section for determining operational specifications of the device under test based on result of the performance judging test; an acceptability judging test executing section for ordering to perform an acceptability judging test to the device under test according to the operational specifications determined by the operational specification determination section; and an acceptability judgment section for judging acceptability of the device under test according to the operational specifications determined by the operational specification determination section based on the result of the acceptability judging test.

The performance judging test executing section may order to perform the performance judging test to the device under test for judging performance of memory of the device under test. The operational specification determination section may determine memory space, which is one of the operational specifications of the device under test, to be a memory space less than that of an operating part of the memory space when a part of the memory is not operating. The acceptability judging test executing section may order to perform the acceptability judging test to the device under test, which is determined as a device including the memory space determined by the operational specification determination section. The acceptability judging section may judge the acceptability of the device under test, which is determined as a device including the memory space determined by the operational specification determination section.

According to the third aspect of the present invention, there is provided a test method for testing a plurality of tested devices in parallel with a plurality of control apparatuses respectively. Each of the plurality of control apparatuses includes steps of: ordering to perform a performance judging test to the device under test for judging performance of the device under test; determining operational specifications of the device under test based on result of the performance judging test; ordering to perform an acceptability judging test to the device under test according to the determined operational specifications; and an acceptability judgment step section for judging acceptability of the device under test according to the determined operational specifications based on the result of the acceptability judging test.

According to the fourth aspect of the present invention, there is provided a test method used for a test apparatus including a plurality of test modules, connected to either of the plurality of devices under test, for supplying a test signal to the connected device under test, and a plurality of control apparatuses for controlling the plurality of test modules, comprising steps of: acquiring a connection switching setting data indicating topology of the plurality of control apparatuses and the plurality of test modules; setting the topology of the plurality of control apparatuses and the plurality of test modules based on the connection switching setting data so that the plurality of control apparatuses connect with the plurality of devices under test respectively; and controlling by the plurality of control apparatus the plurality of test modules and testing the plurality of devices under test in parallel.

The summary of the invention does not necessarily describe all necessary features of the present invention. The present invention may also be a sub-combination of the features described above.

BRIEF DESCRIPTION OF THE DRAWINGS

FIG. 3 is a block diagram exemplary showing a functional configuration of a site control apparatus 130a.

FIG. 6 shows an example of a data configuration of a Config register 250.

FIG. 7 shows an example of connection switching setting data.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
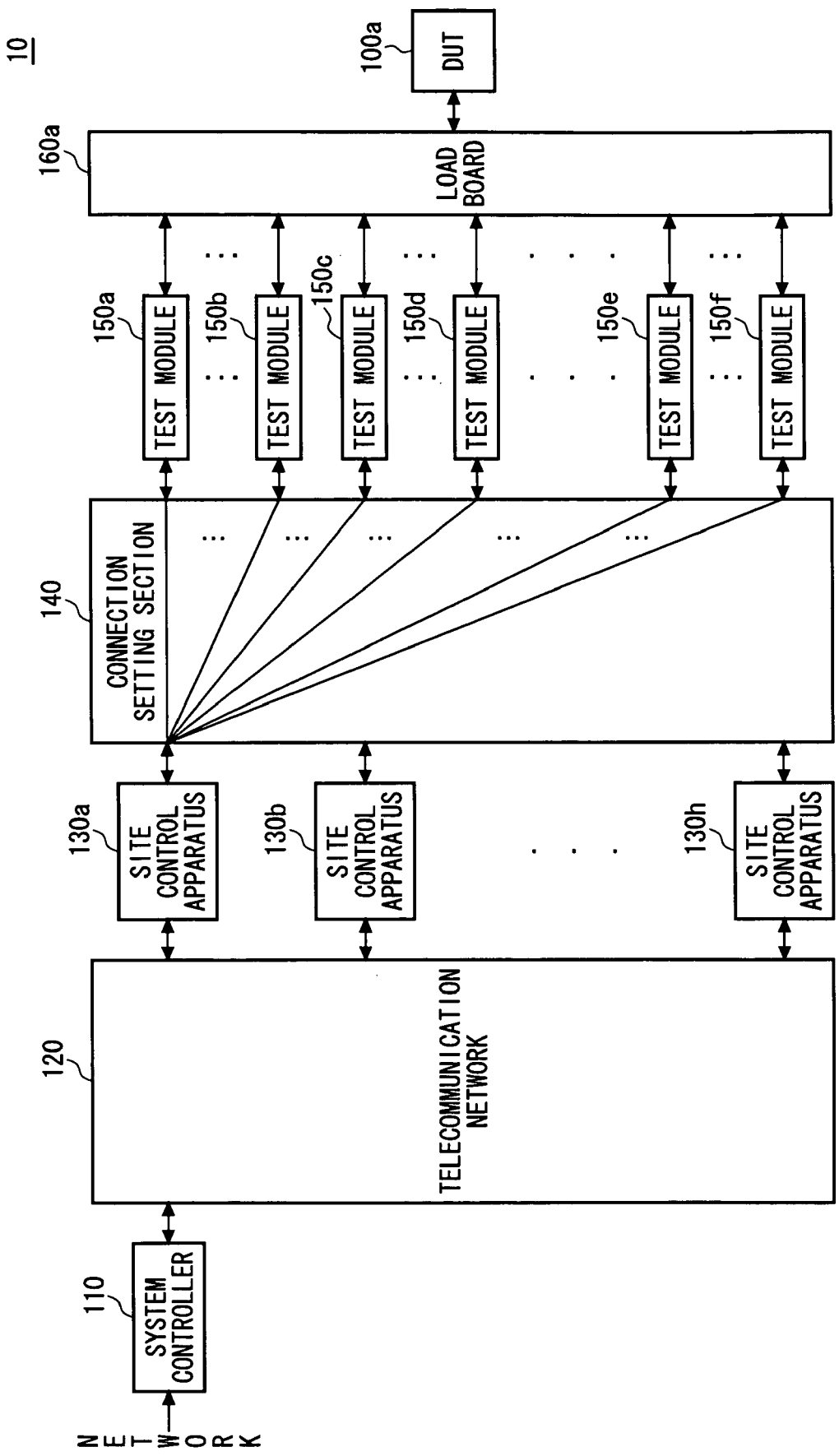
FIG. 1 is a block diagram exemplary showing a configuration of a test apparatus 10.
Figure 2:
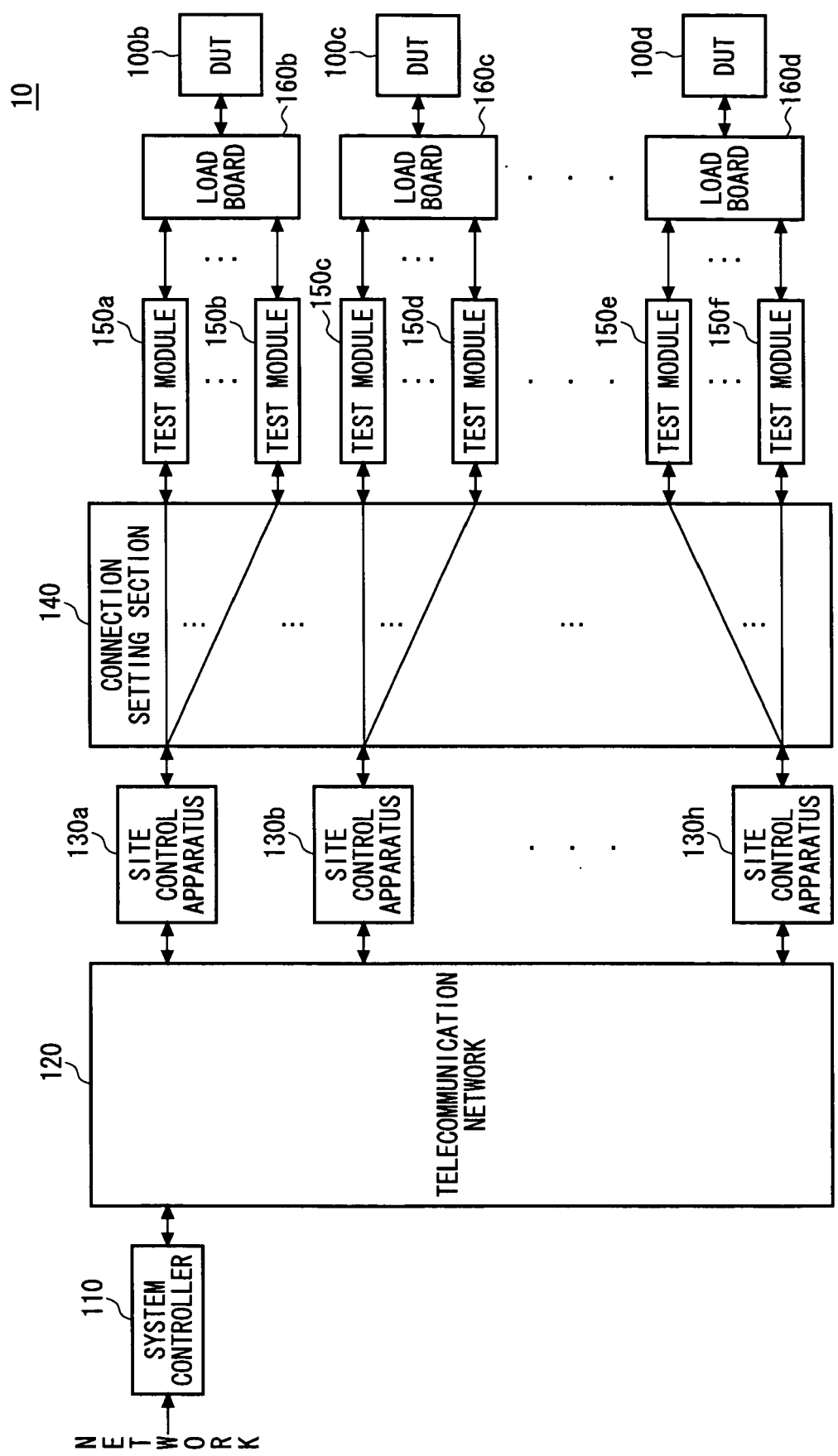
FIG. 2 is a block diagram exemplary showing a configuration of the test apparatus 10.

FIG. 1 and FIG. 2 show block diagrams exemplary showing configurations of a test apparatus 10 according to embodiments of the present invention. The test apparatus 10 generates a test signal, supplies it to a DUT 100 (Device Under Test), and judges acceptability of the DUT 100 based on whether a result signal, which is output as a result of the DUT 100 being operated based on the test signal, coincides with an expected value. The test apparatus 10 according to the present embodiment is realized by an open architecture, and a module based on the open architecture is utilized as a test module 150 for supplying the test signal to the DUT 100. Then, a connection setting section 140 sets topology of a site control apparatus 130 and the test module 150 according to the number of pins of the DUT 100, form of wiring of a load module 160, kind of the test module 150, etc. Thereby, in the test apparatus 10, the site control apparatuses 130 connect with the corresponding DUTs 100 one to one, and one of the site control apparatuses 130 tests the corresponding DUT 100. Therefore, the plurality of site control apparatuses 130a-130h test the plurality of DUTs 100s in parallel, and the plurality of site control apparatuses 130a-130h further perform different test sequences according to the performance of the DUTs 100 respectively.

The test apparatus 10 includes a system controller 110, a telecommunication network 120, the site control apparatuses 130a-130h, the connection setting section 140, the test modules 150a-150f, and load boards 160a-160d, and connect with the DUTs 100a-100d.

The system controller 110 receives and stores a test control program, a test program, test data and the like, which is used for the test apparatus 10 to test the DUTs 100a-100d, through a external network etc. The telecommunication network 120 connects the system controller 110 and the site control apparatuses 130a-130h, and relays communication between them.

The site control apparatuses 130a-130h are examples of control apparatuses according to the present invention. The site control apparatuses 130a-130h control a plurality of test modules, and test each of the plurality of DUTs 100 in parallel. Here, the plurality of site control apparatuses 130a-130h control the test of the plurality of DUTs 100 respectively. For example, in FIG. 1, the site control apparatus 130a connects with the test modules 150a-150f connected to the DUT 100a, and controls the test of the DUT 100a. Moreover, in FIG. 2, the site control apparatus 130a connects with the test modules 150a-150b connected to the DUT 100b, and controls the test of the DUT 100b, and the site control apparatus 130b connects with the test modules 150c-150d connected to the DUT 100c, and controls the test of the DUT 100c.

More specifically, the site control apparatuses 130a-130h acquire the test control program from the system controller 110 through the telecommunication network 120 and execute it. Next, based on the test control program, the site control apparatuses 130a-130h acquire the test program and the test data, which are used for the test of the DUTs 100a-100d, from the system controller 110, and store the min the test modules 150a-150f used for the test of the DUTs 100 through the connection setting section 140. Next, the site control apparatus 130a-130h instruct the start of the test based on the test program and the test data to the test modules 150a-150f through the connection setting section 140. Then, the site control apparatuses 130a-130h receive the interruption, which indicates that the test is completed, from the test modules 150a-150f for example, and cause each of the modules to perform the next test based on the test result. That is, the plurality of site control apparatus 130a-130h control the plurality of test modules 150a-150f according to the test result of the plurality of DUTs 100 respectively, and perform different test sequences to the plurality of DUTs 100 in parallel.

The connection setting section 140 sets the topology of the plurality of site control apparatuses 130a-h and the plurality of test module 150a-150f so that the plurality of site control apparatuses 130a-130h connect with the plurality of DUTs 100 respectively. That is, each of the plurality of site control apparatuses 130a-130h connects with either of the test modules 150a-150f, which are controlled by the site control apparatuses 130a-130h respectively, so as to relay the communication between them.

The connection setting section 140 sets the topology of the plurality of site control apparatuses 130a-130h and the plurality of test modules 150a-150f during the test of the plurality of DUTs 100s by the plurality of site control apparatus 130a-130h based on instruction of a site control apparatus 130 among the plurality of site control apparatuses 130a-130h before the test of the plurality of DUTs 100 by the plurality of site control apparatuses 130a-130h. For example, in FIG. 2, the site control apparatus 130a is set up so that it connects with the plurality of test modules 150a-150b, thereby the test of the DUT 100b is performed. Moreover, the site control apparatus 130b is set up so that it connects with the plurality of test modules 150c-150d, thereby the test of the DUT 100c is performed.

The plurality of DUTs 100 are mounted on the load boards 160a-160d, and the plurality of test modules 150a-150f connect with the corresponding terminals of the DUTs 100.

Since a configuration and operation of the site control apparatuses 130a-130h shown in FIG. 2 for testing the DUTs 100b-100d using the plurality of test modules 150a-150f are substantially the same as that of the site control apparatus 130a shown in FIG. 1 for testing the DUT 10a using the plurality of test modules 150a-150f, the configuration and the operation of the site control apparatus 130a shown in FIG. 1 for testing the DUT 10a will be mainly explained hereinafter unless there is an expectation.

The plurality of test modules 150a-150f connect with a part of the plurality of terminals of the DUT 10a respectively, and test the DUT 10a based on the test program and the test data stored in the site control apparatus 130a. During the test of the DUT 10a, the test modules 150a-150f generate the test signal from the test data based on the sequence defined by the test program, and supply the test signal to the terminals of the DUT 10a connected to the test modules 150a-150f respectively. Then, the result signal, which is output as a result of the DUT 100a being operated based on the test signal, is acquired, whereby the result signal is compared with an expected value and the comparison result is stored.

Moreover, the test modules 150a-150f generate the interruption to the site control apparatus 130a when the processing of the test program has been completed, or when an abnormality occurs during the execution of the test program. The interruption is notified to the site control apparatus 130a corresponding to the test modules 150a-150f through the connection setting section 140, and the interrupt processing is performed by the processor of the site control apparatus 130a.

As stated above, the test apparatus 10 is realized by an open architecture, and various kinds of modules which satisfy the standard of the open architecture are utilized. Then, the test apparatus 10 is utilized by inserting the test modules 150a-150f to any connection slots of the connection setting section 140. In this case, a user of the test apparatus 10 etc. changes the topology of the connection setting section 140 through the site control apparatus 130a for example, and connects the plurality of test modules 150a-150f used for the test of the DUTs 100 and either of the site control apparatuses 130a-130h for controlling the test of the DUTs 100. Thereby, the user of the test apparatus 10 connects appropriately the plurality of site control apparatuses 130a-130h and the test modules 150a-150f according to the number of the terminals, arrangement of the terminals, kind of the terminals, kind of the test, etc., of each of the DUTs 100. Then, the user of the test apparatus 10 makes the site control apparatuses 130 correspond to the DUTs 100 one to one, and the plurality of DUTs 100 are tested in parallel and independently. Therefore, even when the plurality of DUTs 100 are tested by different test sequences, test duration is shortened by testing the plurality of DUTs 100 in parallel.

Figure 3:
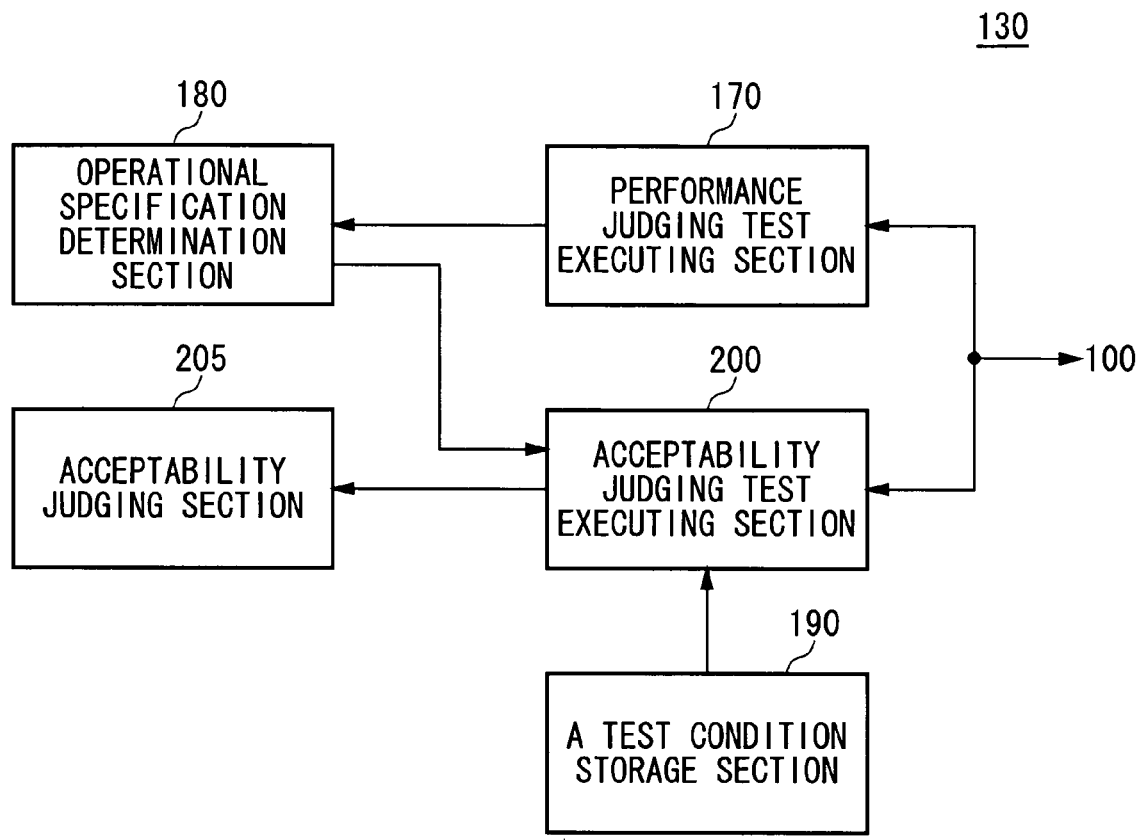

FIG. 3 is a block diagram exemplary showing a functional configuration of the site control apparatus 130 according to the present embodiment. Each of the site control apparatuses 130a-130h includes: a performance judging test executing section 170 for ordering the execution of the performance judging test of the DUT 100 for judging the performance of the DUT 100; an operational specification determination section 180 for determining operational specifications of the DUT 100; a test condition storage section 190 for storing kind of the test condition of an acceptability judging test in association with the operational specifications of the DUT 100; an acceptability judging test executing section 200 for ordering the execution of the acceptability judging test to the DUT 100; and an acceptability judging section 205 for judging the acceptability of the DUT 100 according to the operational specifications determined by the operational specification determination section 180.

The performance judging test executing section 170 causes the test module 150 to perform the performance judging test for judging performance of memory of the DUT 100, such as memory space (e.g., cache size) a test frequency, a system bus frequency, permissible voltage, electric power consumption, drive capability to the system bus, etc., as the performance of the DUT 100. And. The operational specification determination section 180 determines the memory space, the test frequency, the system bus frequency, the permissible voltage, the electric power consumption, the drive capability, etc. as the operational specifications of the DUT 100 based on the result of the performance judging test by the performance judging test executing section 170. For example, when a part of the memory of the DUT 100 is not operating, the memory space, which is one of the operational specifications of the DUT 100, is determined to be the memory space less than that of an operating part of the memory of the DUTs 100.

Then, the acceptability judging test executing section 200 selects the test condition of the acceptability judging test from the test condition storage section 190 according to the operational specifications determined by the operational specification determination section 180. Then, the acceptability judging test executing section 200 causes the test module 150 to perform the acceptability judging test according to the operational specifications determined by the operational specification determination section 180. Specifically, the acceptability judging test is performed to the DUT 100, assuming that the DUT 100 is a device including the memory space determined by the operational specification determination section 180 and operating at the test frequency, the system bus frequency, the permissible voltage, the electric power consumption, and/or the drive capability, which are determined by the operational specification determination section 180. Then, the acceptability judging section 205 judges the acceptability of the DUT 100 based on the result of the acceptability judging test by the acceptability judging test executing section 200, assuming that the DUT 100 is a device including the memory space determined by the operational specification determination section 180 and operating at the test frequency, the system bus frequency, the permissible voltage, the electric power consumption, and/or the drive capability, which are determined by the operational specification determination section 180.

According to the site control apparatus 130 of the present embodiment, the operational specifications are determined and selected based on the result of the performance test of the DUT 100, the test is performed by the test sequence according to the selected operational specifications, and then it judges whether the conditions according to the selected operational specifications are satisfied. Furthermore, since the plurality of site control apparatuses 130a-130h correspond to the plurality of DUTs 100 one to one, the plurality of site control apparatuses 130a-130h perform the test of the plurality of DUTs 100 using different sequences respectively in parallel, thereby the selection of the operational specifications and the test are performed efficiently.

Figure 4:
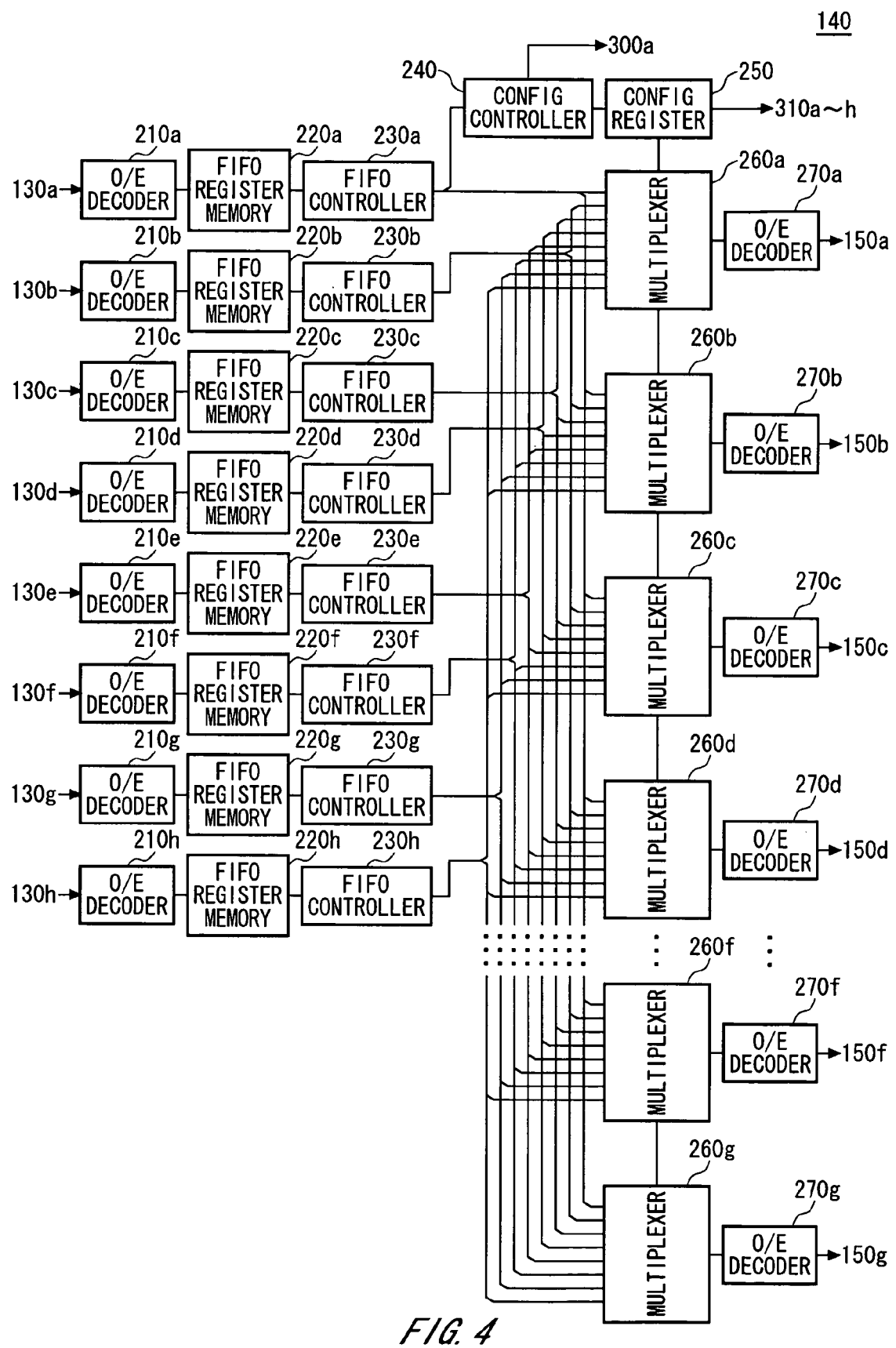
FIG. 4 is a block diagram exemplary showing a hardware configuration of a connection setting section 140.

FIG. 4 is a block diagram exemplary showing the hardware configuration of the connection setting section 140 according to the present embodiment. FIG. 4 shows a portion used for data transfer from the site control apparatus 130 to the test module 150 among the hardware configuration of the connection setting section 140.

The connection setting section 140 includes a plurality of O/E decoders 210a-210h, a plurality of FIFO register memories 220a-220h, a plurality of FIFO controllers 230a-230h, a Config controller 240, a Config register 250, a plurality of multiplexers 260a-260g, and a plurality of O/E decoders 270a-270g.

The plurality of O/E decoders 210a-210h receive the control data, such as write-in command and write-in data or read-out command to/from the record area in the test modules 150a-150f, from the plurality of site control apparatuses 130a-130h respectively, carry out photoelectric conversion of the control data, and supply them to the plurality of FIFO register memories 220a-220h respectively. The plurality of FIFO register memories 220a-220h acquire the control data, of which the photoelectric conversion is performed by the plurality of O/E decoders 210a-210h respectively, and temporarily store them. The plurality of FIFO controllers 230a-230h read the control data from the plurality of FIFO register memories 220a-220h respectively, and supply them to the plurality of multiplexers 260a-260g respectively.

The Config-controller 240 acquires setting data including connection switching setting data of the connection setting section 140 among the control data read by the FIFO controller 230a. The connection switching setting data indicates topology of the site control apparatuses 13-a-h and the test modules 150a-g. Then, the Config register 250 stores the connection switching setting data acquired by the Config controller 240, and sets up the plurality of multiplexers 260a-260g. The plurality of multiplexers 260a-260g select either of the control data read by the FIFO controllers 230a-230h based on the connection switching setting data stored in the Config register 250, and supply it to the plurality of O/E decoders 270a-270g respectively. The plurality of O/E decoders 270a-270g carry out current to light transference of the control data selected by the plurality of multiplexers 260a-260g respectively, and transmit them to the test modules 150a-150g respectively.

As described above, when the Config register 250 stores the connection switching setting data supplied from the site control apparatus 130a, the multiplexers 260a-260g are set up, and the site control apparatuses 130a-130h and the test modules 150a-150g are connected so that the plurality of site control apparatuses 130a-130h correspond to the plurality of DUT 100s one to one.

Figure 5:
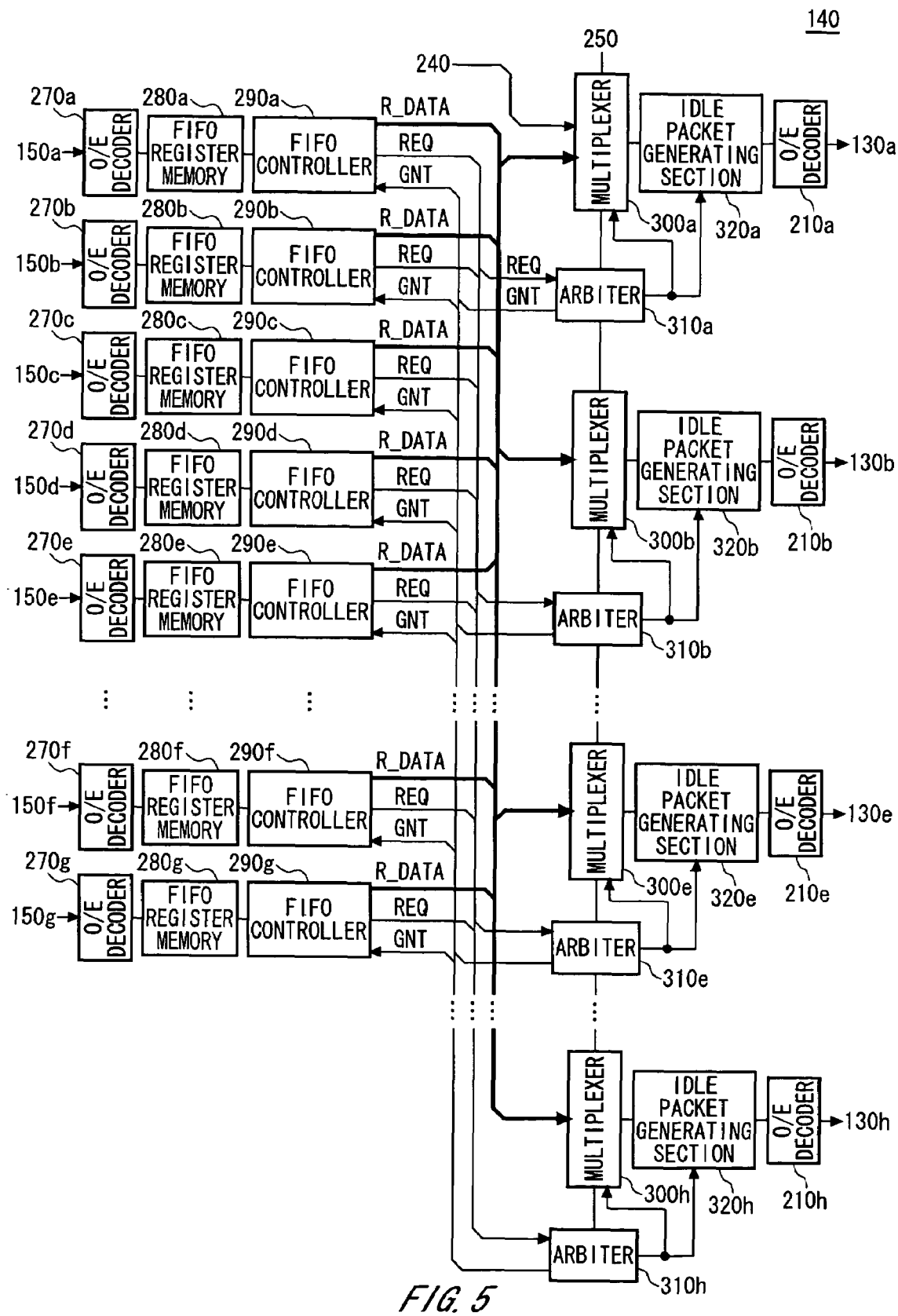
FIG. 5 is a block diagram exemplary showing a hardware configuration of the connection setting section 140.

FIG. 5 is a block diagram exemplary showing a hardware configuration of the connection setting section 140 according to the present embodiment. FIG. 5 shows a part of the hardware configuration of the connection setting section 140, the part being used for the transfer of the data, such as a response to the write-in command or read-out data in response to the read-out command, from the test module 150 to the site control apparatus 130.

The connection setting section 140 further includes a plurality of FIFO register memories 280a-280g, a plurality of FIFO controllers 290a-290g, a plurality of multiplexers 300a-300h, a plurality of arbiters 310a-310h, and a plurality of IDLE packet generating sections 320a-320h. In addition, the O/E decoders 210a-210h are examples of the serial interface of the present invention, and transmit the data packets received from the test modules 150a-150g to the site control apparatuses 130a-130h.

The plurality of O/E decoders 270a-270g receive the read-out data, which are the data indicating the test result of the DUT 100 and output from the plurality of test modules 150a-150g respectively based on the demand of the plurality of site control apparatuses 130a-130h. Then the plurality of O/E decoders 270a-270g carry out photoelectric conversion of the read-out data and supply them to the plurality of FIFO register memories 280a-280g respectively. The plurality of FIFO register memories 280a-280g acquire the read-out data, of which the photoelectric conversion is carried out by the plurality of O/E decoders 270 respectively, and temporarily store the read-out data. The plurality of FIFO controllers 290a-290g read the read-out data from the plurality of FIFO register memories 280a-280g respectively.

Each of the plurality of FIFO controllers 290a-290g includes a plurality of REQ output terminals for requesting data transfer to the plurality of multiplexers 300a-300h, and outputs a request command (REQ) to the arbiter 310 which requests the data transfer. Moreover, each of the FIFO controllers 290a-290g includes a GNT input terminal for receiving a response from the plurality of arbiters 310a-300h in response to the REQ, and receives a grant command (GNT) from the multiplexer 300 which requests the data transfer.

First, the plurality of FIFO controllers 290a-290g supply the REQ to either of arbiters 310a-310h corresponding to the site control apparatus 130 for supplying the read-out data when they supply the read-out data (R_DATA) to either of the site control apparatuses 130a-130h. When the REQ is received from either of the FIFO controllers 290, the arbiters 310a-310h supply the grant command (GNT) to the FIFO controller 290, which permits the output of the read-out data, among the FIFO controllers 290a-290g based on the connection switching setting data stored in the Config register 250. Then, the FIFO controller 290, which receives the GNT, supplies the R_DATA to the multiplexers 300a-300h.

Based on the control of the arbiters 310a-310h, the plurality of multiplexers 300a-300h select the R_DATA from the FIFO controller 390, to which the arbiters 310a-310h supply the GNT, respectively, and supply them to the plurality of O/E decoders 210a-210h respectively. The plurality of O/E decoders 210a-210h carry out the current to light transference of the R_DATA selected by the plurality of multiplexers 300a-300h respectively, and transmit them to the corresponding control apparatuses 130a-130h respectively.

In case that the plurality of O/E decoders 210a-210h do not receive the data packet from the test modules 150a-150g (i.e., in case that the arbiters 310a-310h have selected neither of the FIFO controllers 290a-290g), the IDLE packet generating sections 320a-320h supply an IDLE packet in the serial data transmitted by the plurality of O/E decoders 210a-210h to fill empty space of the serial data transmitted by the plurality of O/E decoders 210a-210h to the test modules 150a-150g. Moreover, the multiplexer 300a acquires the setting data, which the Config controller 240 reads from the Config register 250, and supplies it to the site control apparatus 130a.

As described above, when the arbiters 310a-310h select the FIFO controllers 290a-290g, from which the multiplexers 300a-300h are to acquire the read-out data, based on the connection switching setting data stored in the Config register 250, the site control apparatus 130 acquires the read-out data from the test module 150 which has transmitted the control data. Further, the PLL circuit of the test modules 150a-g always maintains the internal clock to be phase-locked by not generating any blank or empty in the serial data transmitted by the IDLE packet generating sections 320a-320h to the test modules 150a-g, so that the serial data can be transferred at high speed without generating any shift or deviation of the internal clock in the test modules 150a-g.

FIG. 6 shows an example of the data configuration of the Config register 250 according to the present embodiment. The Config register 250 stores the connection switching setting data (Switch Select1-Switch Select8) in association with address (17h-1Eh), i.e., the site control apparatus 130 selected by the plurality of multiplexers 260 respectively. For example, the Switch Select 1 stored in address 17h is the connection switching setting data for setting up the 1-8th multiplexers 260, and the Switch Select 2 stored in address 18h is the connection switching setting data for setting up the 9-16th multiplexers 260. The Config register 250 stores the connection switching setting data, of which the number corresponds to the number of the multiplexers 260 of the connection setting section 140.

FIG. 7 shows an example of the connection switching setting data according to the present embodiment. FIG. 7 shows concrete contents of the connection switching setting data (Switch Select 1) 300 shown in FIG. 6.

The Config-register 250 stores a number of the site control apparatus 130 (CPU NO.) and validity of the setting (ON/OFF) in association with the ports (Port1-Port8) of the connection setting section 140. The ports (Port1-Port8) of the connection setting section 140 corresponds to the 1-8th multiplexers 260, and the number of the site control apparatus 130 (CPU NO.) indicates the site control apparatus 130 selected by the 1-8th multiplexers 260.

In the present embodiment, although the Config register 250 stores the validity of the setup of the connection switching of the connection setting section 140, the same function as the present embodiment is realized by another means, such as the site control apparatus 130 controlling the validity of the setup.

By the data configuration of the Config register 250 described above, it is realizable for the plurality of site control apparatus 130 to test the plurality of DUTs 100 in parallel, by switching the site control apparatus 130 selected by the plurality of multiplexers 260, and by connecting the site control apparatus 130 and the DUT 100 so that they correspond to each other one to one.

Next, an example of the specification of the connection setting section 140 according to the present embodiment will be shown.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As described above, according to the present invention, the test apparatus and the test method for testing a plurality of DUTs in parallel are realizable.

What is claimed is:

1. A test method used for a test apparatus including a plurality of test modules, connected to either of a plurality of devices under test, for supplying a test signal to the connected device under test, and a plurality of control apparatuses for controlling the plurality of test modules, and a connection setting section for switching topology of the plurality of control apparatuses and the plurality of test modules, the connection setting section being connected with both the plurality of control apparatuses and the plurality of test modules, comprising steps of:

acquiring a connection switching setting data indicating which one of the plurality of control apparatuses is to be connected with each of the plurality of test modules;

connecting each of the plurality of control apparatuses with the plurality of test modules based on the connection switching setting data for connecting each control apparatus with the plurality of devices under test; and controlling the plurality of test modules by the connected control apparatus and testing the plurality of devices under test in parallel.

2. The test method used for the test apparatus as claimed in claim 1, wherein said connection switching setting data vary from at least one of the number of terminals of each of the devices under test, arrangement of the terminals of each of the devices under test, kind of the terminals of each of the devices under test and kind of a test of each of the devices under test.

* * * * *